(12) United States Patent
Aikawa

(10) Patent No.: US 6,735,101 B2
(45) Date of Patent: May 11, 2004

(54) SEMICONDUCTOR MEMORY

(75) Inventor: Tadao Aikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/390,594

(22) Filed: Mar. 19, 2003

(65) Prior Publication Data

US 2003/0189861 A1 Oct. 9, 2003

(30) Foreign Application Priority Data

Apr. 9, 2002 (JP) ........................................ 2002-105898

(51) Int. Cl.$^7$ ............................................... G11C 15/00
(52) U.S. Cl. ................ 365/49; 365/230.03; 365/189.07
(58) Field of Search ............................. 365/49, 230.03, 365/230.05, 189.07

(56) References Cited

U.S. PATENT DOCUMENTS 6,339,539 B1 * 1/2002 Gibson et al. ................ 365/49
6,609,222 B1 * 8/2003 Gupta et al. ................ 714/733

FOREIGN PATENT DOCUMENTS

| JP | 03-212896 | 9/1991 |
|---|---|---|
| JP | 06-333395 A | 12/1994 |
| JP | 2000-149573 | 5/2000 |

* cited by examiner

Primary Examiner—Connie C. Yoha
(74) Attorney, Agent, or Firm—Arent Fox PLLC

(57) ABSTRACT

A semiconductor memory that reduces power consumed by a CAM. A storage circuit has stored a plurality of patterns of information indicative of whether to activate each memory word block. If specification information for specifying a predetermined pattern from among the plurality of patterns of information which has been stored in the storage circuit is input, an activation circuit activates each content addressable memory word block according to a specified pattern. If data to be retrieved is input, a specification circuit specifies a content addressable memory word which has stored data corresponding to the data to be retrieved from among a group of content addressable memory words activated by the activation circuit. As a result, activation will be performed by the content addressable memory word block. Therefore, by activating only necessary content addressable memory words, consumption of power can be reduced.

8 Claims, 22 Drawing Sheets

|  | 0 | 1 | 2 | 16 | 29 | 30 | 31 |
|---|---|---|---|---|---|---|---|
| BE Reg. [0] | 0 | 0 | 0 | 1 | 0 | 0 | 0 |
| BE Reg. [1] | 0 | 1 | 1 | 1 | 1 | 1 | 1 |
| BE Reg. [2] | 1 | 1 | 1 | 0 | 0 | 0 | 0 |
| BE Reg. [3] | | | | | | | |
| ⋮ | | | | | | | |
| BE Reg. [12] | | | | | | | |
| BE Reg. [13] | 0 | 0 | 0 | 1 | 1 | 1 | 1 |
| BE Reg. [14] | 1 | 1 | 1 | 1 | 1 | 1 | 1 |
| BE Reg. [15] | 0 | 0 | 0 | 0 | 0 | 0 | 0 |

FIG. 6

| VALUE WHICH HAS BEEN STORED | | | VALUE TO BE RETRIEVED | | | ML | JUDGMENT |
|---|---|---|---|---|---|---|---|
| LOGICAL VALUE | N1 | N2 | LOGICAL VALUE | SD | XSD | | |
| 1 | 1 | 0 | 0 | 1 | 0 | 0 | MISMATCH |
| | | | 1 | 0 | 1 | 1 | MATCH |
| 0 | 0 | 1 | 0 | 1 | 0 | 1 | MATCH |
| | | | 1 | 0 | 1 | 0 | MISMATCH |
| X | 0 | 0 | 0 | 1 | 0 | 1 | MATCH |
| | | | 1 | 0 | 1 | 1 | MATCH |

FIG. 20
PRIOR ART

SEMICONDUCTOR MEMORY

CROSS-REFERENCE TO RELATED APPLICATIONS

This application is based on, and claims priority to, Japanese Application No. 2002-105898, filed Apr. 9, 2002, in Japan, and which is incorporated herein by reference.

BACKGROUND OF THE INVENTION (1) Field of the Invention

This invention relates to a semiconductor memory and, more particularly, to a semiconductor memory, such as a content addressable memory (CAM), which outputs an address where data to be retrieved is stored.

(2) Description of the Related Art

Retrieval operation for retrieving an address where input data (data to be retrieved) is stored is the characteristic operation of CAMs. Data to be retrieved input from the outside and data in a cell are compared by this retrieval operation. Cells in a CAM which enable this operation have a structure shown in FIG. 19.

As shown in FIG. 19, one cell included in a CAM includes metal oxide semiconductor (MOS) transistors (hereinafter referred to simply as transistors) 1a, 2a, 3a, 6a, 1b, 2b, 5b, and 6b and inverters 3a, 4a, 3b, and 4b.

The transistors 1a and 2a and the inverters 3a and 4a store an ordinary bit. The transistors 1b and 2b and the inverters 3b and 4b store an auxiliary bit.

The transistors 5a, 5b, 6a, and 6b judge whether or not signals applied to retrieval data lines SD and XSD match data which has been stored in the cell.

Signal lines XBL0, BL0, XBL1, and BL1 are used to write and read data.

Data to be retrieved is input to the retrieval data lines SD and XSD. A word line WL is a selection control signal line located in the direction of a row of cells. A match line ML is a match detection signal line for transmitting the result of matching located in the direction of a row of cells.

Now, operation in the above conventional CAM will be described. FIG. 20 is a truth table showing the state of the cell shown in FIG. 19. As shown in FIG. 20, the cell shown in FIG. 19 stores the logical value "1," "0," or "X (undefined)." To be concrete, assuming that the input sides of the transistors 6a and 6b are N1 and N2 respectively, the state in which N1 is "L" and N2 is "H" corresponds to "1," the state in which N1 is "H" and N2 is "L" corresponds to "0," and the state in which N1 is "L" and N2 is "L" corresponds to "X."

For example, if the logical value "1" has been stored and "0" is input as a value to be retrieved, that is to say, if the retrieval data line SD is put into the "H" state and the retrieval data line XSD is put into the "L" state, then the transistors 5a and 6a go into the ON state and the transistors 5b and 6b go into the OFF state. As a result, the match line ML is grounded by the transistors 5a and 6a and goes into the "L" state. A mismatch therefore will be detected.

On the other hand, if the logical value "1" has been stored and "1" is input as a value to be retrieved, that is to say, if the retrieval data line SD is put into the "L" state and the retrieval data line XSD is put into the "H" state, then the transistors 5b and 6a go into the ON state and the transistors 5a and 6b go into the OFF state. As a result, the match line ML is not grounded and remains in the "H" state. A match therefore will be detected.

The above is basic operation in one memory cell.

Now, a content addressable memory word (hereinafter referred to simply as a memory word) in which a plurality of memory cells, each of which is the same as the one shown in FIG. 19, are connected will be described.

FIG. 21 is a view showing the structure of a memory word. As shown in FIG. 21, a memory word includes a plurality of memory cells connected, each of which is the same as the one shown in FIG. 19. In this example, only two memory cells 10 and 11 are shown, but in reality more memory cells are connected.

The memory cells 10 and 11 are wired-OR-connected to a match line ML. If data to be retrieved input to the memory cells 10 and 11 via retrieval data lines SD1 and XSD1 and retrieval data lines SD2 and XSD2, respectively, does not match data which has been stored in them, then the match line ML is grounded.

The memory cell 10 includes storage sections 10a and 10b and transistors 10c through 10f. Each of the storage sections 10a and 10b corresponds to the two transistors and two inverters shown in FIG. 19.

The memory cell 11 also includes storage sections 11a and 11b and transistors 11c through 11f. Each of the storage sections 11a and 11b also corresponds to the two transistors and two inverters shown in FIG. 19.

An inverter 13 inverts a signal applied to the match line ML and outputs it as an output signal OUT.

When a pre-charge line MLEZ goes into the "L" state, a transistor 12 pre-charges the match line ML.

Now, operation in the above example will be described.

FIG. 22 is a timing chart for describing operation in the above example.

At time T0 the circuit is in a standby state. The pre-charge line MLEZ is in the "L" state (see FIG. 22(A)), so the match line ML is in a pre-charged state.

At time T1 the pre-charge line MLEZ goes into the "H" state (see FIG. 22(A)). Then the transistor 12 goes into the OFF state and the match line ML is released from the pre-charged state.

At time T2 the data "0" to be retrieved is input. Then the retrieval data line SD1 goes into the "H" state (see FIG. 22(B)) and the retrieval data line XSD1 goes into the "L" state (see FIG. 22(C)).

Assuming that the data "1" has been stored in the memory cell 10 at this time, output from the storage section 10a goes into the "H" state and output from the storage section 10b goes into the "L" state.

As a result, both the transistors 10c and 10d go into the ON state. Therefore, the match line ML is grounded and goes into the "L" state (see FIG. 22(D)).

The match line ML goes into the "L" state and at time T3 output from the inverter 13 goes into the "H" state. This indicates that a mismatch has occurred in the memory word.

At time T4 the pre-charge line MLEZ goes into the "L" state and the match line ML is charged and goes into the "H" state. As a result, one cycle ends.

By the way, the above retrieval operation is performed on the entire chip. For example, if a memory word includes N cells and there are M memory words in the entire device, then N×M memory cells will operate at the same time.

Operating a memory cell involves charging and discharging the match line ML and driving the retrieval data line SD. Therefore, a large amount of power will be consumed to drive these N×M memory cells.

SUMMARY OF THE INVENTION

The present invention was made under the background circumstances as described above. An object of the present invention is to provide a semiconductor memory which consumes only a small amount of power at retrieval operation time.

In order to achieve the above object, a semiconductor memory comprising a plurality of content addressable memory words, a plurality of memory cells connected to each content addressable memory word, memory word blocks each including N content addressable memory words, a storage circuit which has stored a plurality of patterns of information indicative of whether to activate each memory word block, an activation circuit for activating each content addressable memory word block according to a specified pattern in the case of specification information for specifying a predetermined pattern from among the plurality of patterns of information which has been stored in the storage circuit being input, and a specification circuit for specifying a content addressable memory word which has stored data corresponding to data to be retrieved from among a group of content addressable memory words activated by the activation circuit in the case of the data to be retrieved being input is provided.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 is a view showing the structure of a register which has stored information for specifying a memory word block to be activated.

FIG. 20 is a truth table for describing operation in the cell shown in FIG. 19.

DESCRIPTION OF THE PREFERRED EMBODIMENTS

Embodiments of the present invention will now be described with reference to the drawings.

Figure 1:
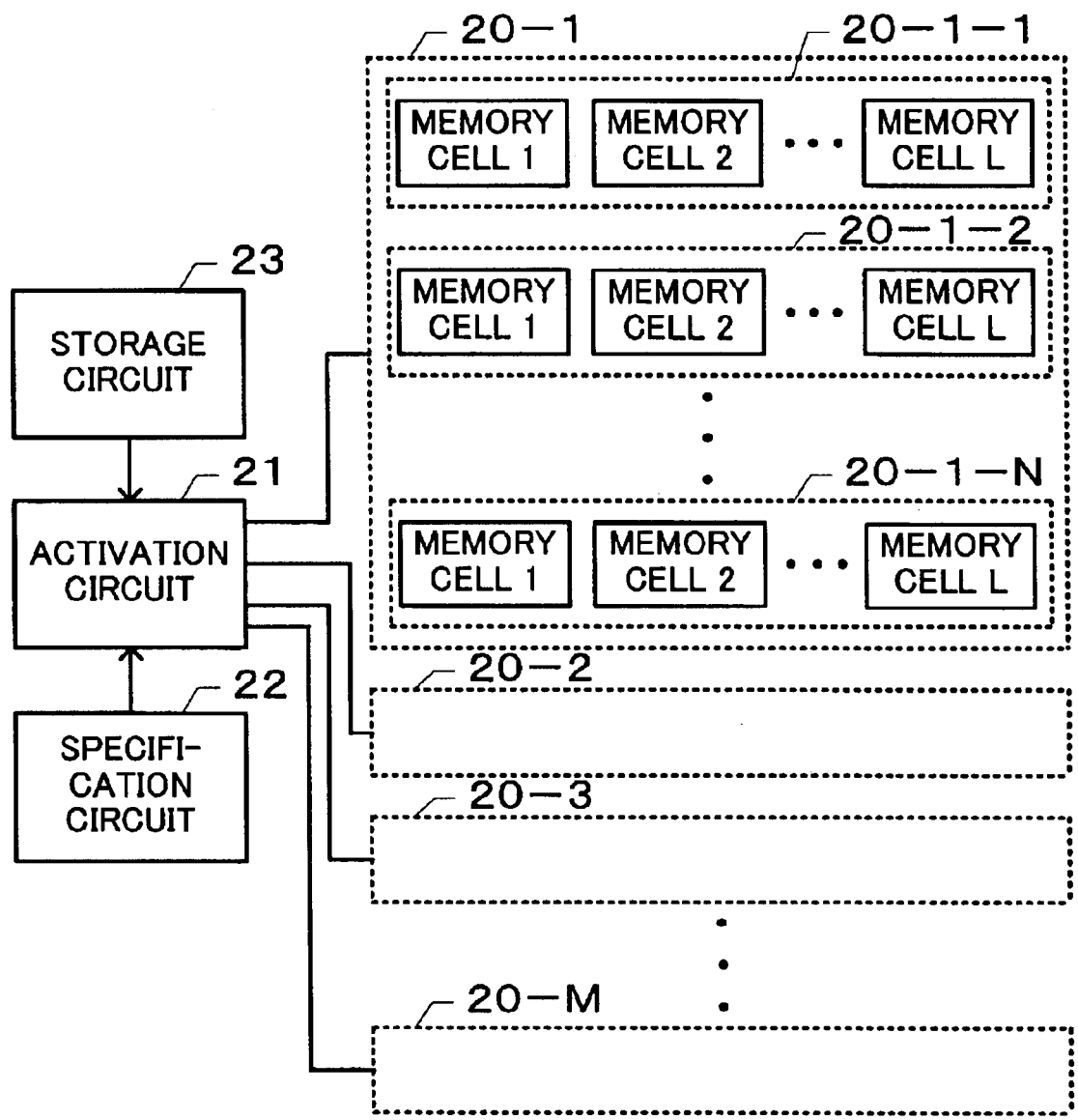
FIG. 1 is a view for describing the principles underlying operation in the present invention.

FIG. 1 is a view for describing the principles underlying operation in the present invention. As shown in FIG. 1, a semiconductor memory according to the present invention comprises content addressable memory word blocks (hereinafter referred to simply as memory word blocks) 20-1 through 20-M, an activation circuit 21, a specification circuit 22, and a storage circuit 23.

Each of the memory word blocks 20-1 through 20-M includes N memory words. For example, the memory word block 20-1 includes memory words 20-1-1 through 20-1-N. The memory word 20-1-1, for example, includes memory cells 1 through L and can store L-bit data.

The storage circuit 23 has stored a plurality of patterns of information indicative of whether to activate each of the memory word blocks 20-1 through 20-M.

If specification information for specifying a predetermined pattern from among a plurality of patterns of information which has been stored in the storage circuit 23 is input, the activation circuit 21 activates each content addressable memory word block according to a specified pattern.

If data to be retrieved is input, the specification circuit 22 specifies a content addressable memory word block which has stored data corresponding to the data to be retrieved from among a group of content addressable memory words activated by the activation circuit 21.

Now, operation in FIG. 1 will be described.

It is assumed that the storage circuit 23 has stored information indicative of the activation pattern of activating only the memory word blocks 20-1 and 20-2 and another activation pattern (for example, the activation pattern of activating only the memory word blocks 20-3 and 20-4).

In this state of things, it is assumed that information for specifying the information indicative of the activation pattern of activating only the memory word blocks 20-1 and 20-2 is input (the amount of the former information is smaller than that of the latter information, that is to say, of the information which has been stored in the storage circuit 23). Then the activation circuit 21 activates the memory word blocks 20-1 and 20-2 on the basis of the input information. To be concrete, the activation circuit 21 puts sense amplifiers (for amplifying output from a match line) and drivers (for supplying data to be retrieved to each memory cell) included in the memory word blocks 20-1 and 20-2, which are not shown, into an operating state and puts sense amplifiers and drivers included in the memory word blocks 20-3 through 20-M into a non-operating state.

The specification circuit 22 supplies data to be retrieved to each of the memory word blocks 20-1 and 20-2 activated by the activation circuit 21 and makes them perform retrieval operation. As a result, if data which has been stored in the memory word 20-1-1, for example, matches the data to be retrieved, only a match line connected to the memory word 20-1-1 goes into the "H" state and the other match lines go into the "L" state. Therefore, a memory word which has stored the data to be retrieved can be specified.

As stated above, in the present invention memory word blocks including N memory words are located and an object for retrieval is activated by the memory word block by the activation circuit 21. Unnecessary memory word blocks therefore can be put into a resting state. This will reduce the amount of power consumed by the entire device.

Moreover, information indicative of a plurality of activation patterns has been stored in the storage circuit 23 and memory word blocks are activated on the basis of this information. Therefore, a memory word block to be activated can be specified on a small amount of information.

Now, an embodiment of the present invention will be described.

Figure 2:
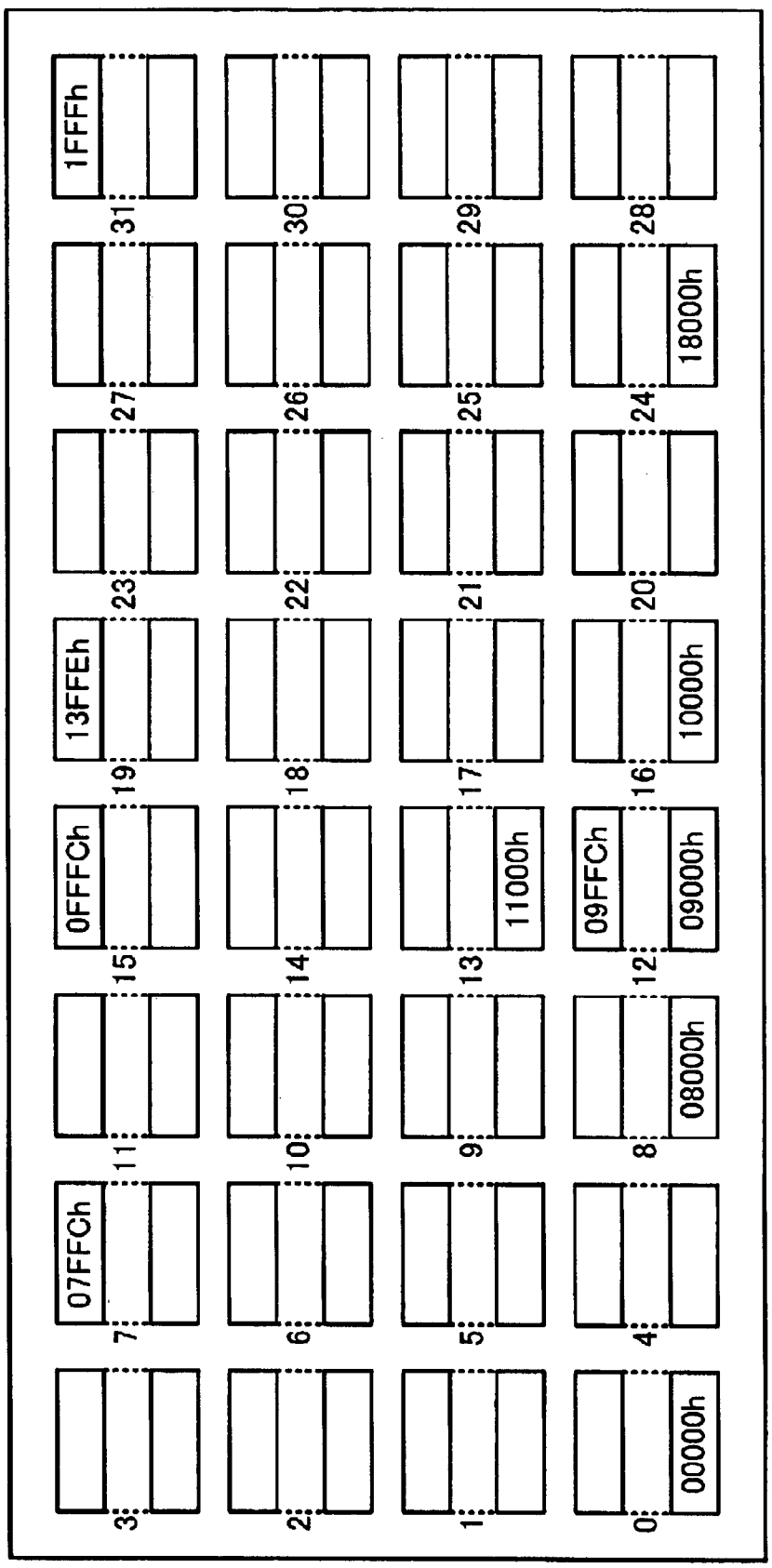
FIG. 2 is a view showing the structure of an embodiment of the present invention.

FIG. 2 is a view showing the structure of an embodiment of the present invention. FIG. 2 is a view showing how to divide memory words in the present invention. In this example, a memory word includes 72 bits and there is a memory word of 128 kwls. This memory word of 128 kwls is divided into 32 memory word blocks (hereinafter described as memory words #0 through #31), so each memory word block includes a memory word of 4 kwls.

Figure 3:
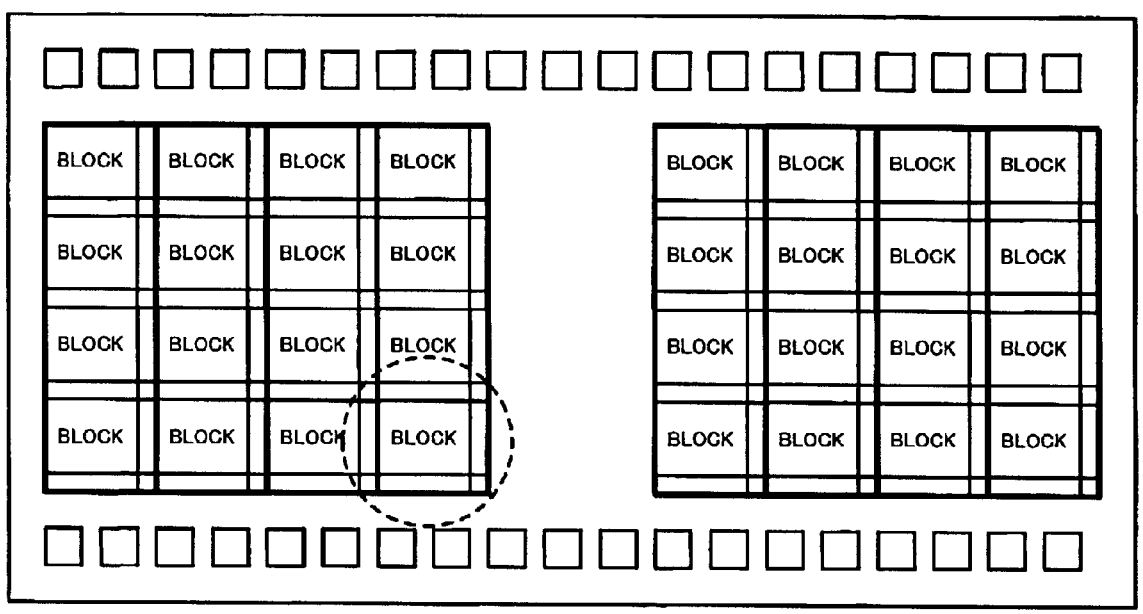
FIG. 3 is a view showing the more detailed structure of the embodiment shown in FIG. 2.
Figure 4:
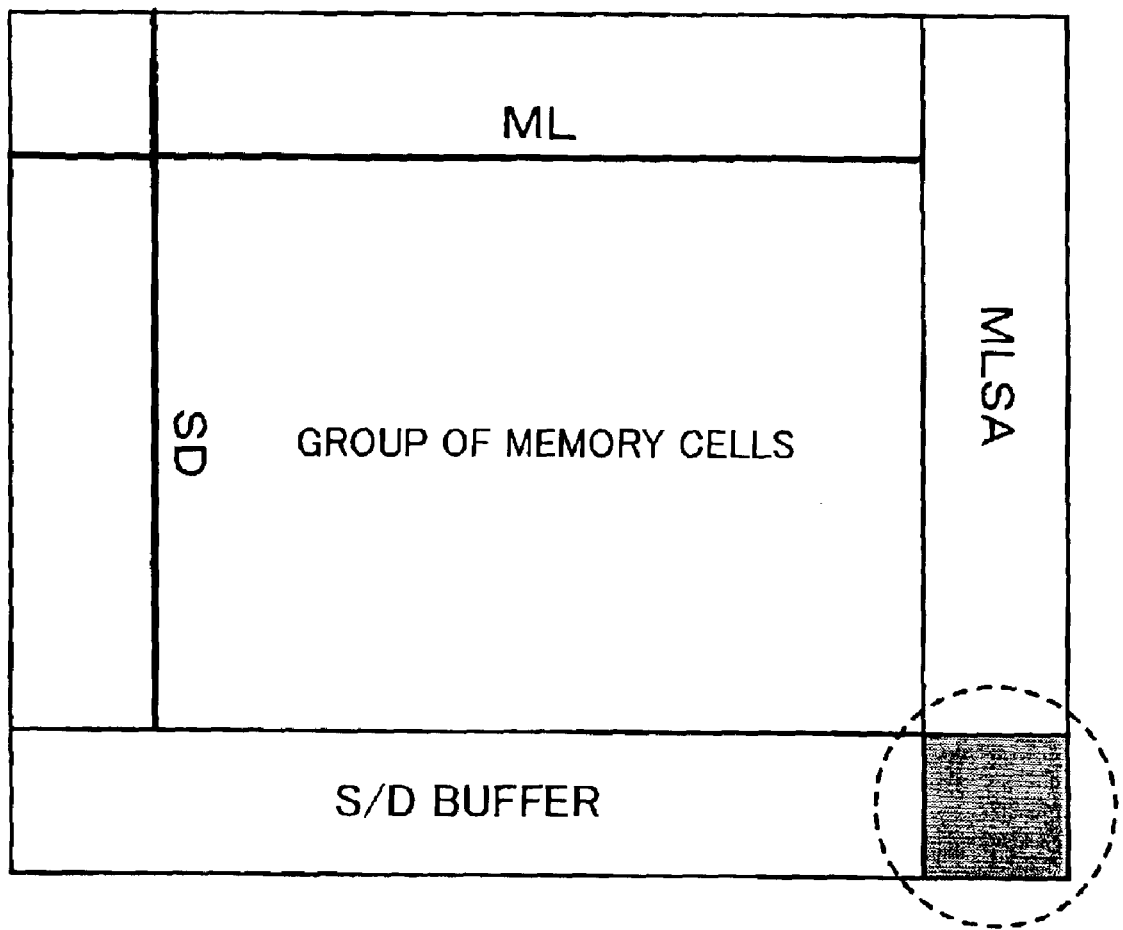
FIG. 4 is a view showing the detailed structure of an area enclosed with a dashed line shown in FIG. 3.

FIG. 3 is a view showing the more detailed structure of the embodiment shown in FIG. 2. As shown in FIG. 3, each of the memory word blocks arranged on a semiconductor substrate includes a memory word of 4 kwls and they are divided in two. FIG. 4 is an enlarged view of the memory word block #12 enclosed with a dashed line in FIG. 3. As shown in FIG. 4, a group of memory cells are arranged in the middle area of the memory word block #12 and a match line ML and a retrieval data line SD are connected to each memory cell. Output from the match line ML is amplified by a match line sense amplifier MLSA (hereinafter referred to simply as an MLSA) and is output. The retrieval data line SD is controlled by an S/D buffer. A control circuit is located in an area enclosed with a dashed line in FIG. 4 to control the MLSA and the S/D buffer.

Figure 5:
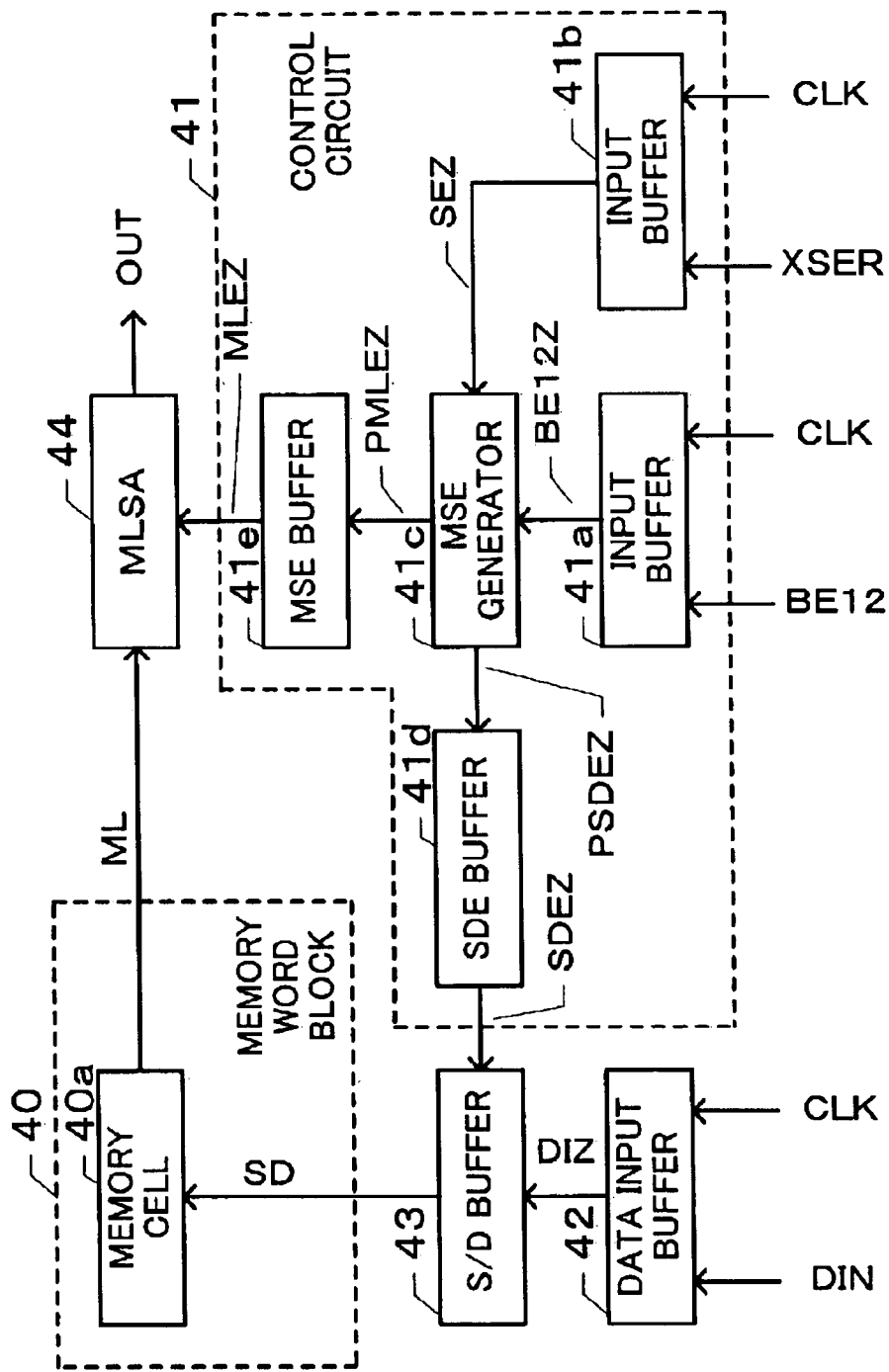
FIG. 5 is a view showing the detailed structure of an area enclosed with a dashed line shown in FIG. 4.

FIG. 5 is a view showing the structure of a portion related to the control circuit shown in FIG. 4.

As shown in FIG. 5, a control circuit 41 includes an input buffer 41a, an input buffer 41b, an MSE generator 41c, an SDE buffer 41d, and an MSE buffer 41e. The control circuit 41 puts an S/D buffer 43 and an MLSA 44 into an operating or non-operating state according to whether or not the memory word block #12 is an object for activation.

The input buffer 41a latches signal BE12 (described later) indicative of whether to activate the memory word block #12 supplied from a register described later by a CLK signal and supplies it to the MSE generator 41c as a BE12Z signal.

The input buffer 41b latches a retrieval signal XSER by a CLK signal and supplies it to the MSE generator 41c as an SEZ signal.

If an SEZ signal supplied from the input buffer 41b is active (which indicates that a retrieval signal has been input) and a BE12Z signal is active (which indicates that the memory word block is an object for activation), the MSE generator 41c makes a PSDEZ signal and a PMLEZ signal supplied to the SDE buffer 41d and the MSE buffer 41e, respectively, active.

If a PSDEZ signal has been made active, the SDE buffer 41d makes an SDEZ signal active to put the S/D buffer 43 into an operable state.

If a PMLEZ signal has been made, active, the MSE buffer 41e makes an MLEZ signal active to put the MLSA 44 into an operable state.

A data input buffer 42 latches input data DIN input in synchronization with a clock signal CLK and outputs it as a DIZ signal.

The S/D buffer 43 supplies a DIZ signal supplied from the data input buffer 42 to a memory cell 40a in a memory word block 40. In this example, one memory cell 40a is shown, but in reality there are 72×4 kwls of memory cells.

The MLSA 44 amplifies voltage applied to the match line ML and outputs it.

FIG. 6 is a view showing the structure of a register which has stored information for specifying a memory word block to be activated.

In this example, there are sixteen registers, that is to say, block enable (BE) registers (Reg.) [0] through [15]. Each register includes 32 bits, that is to say, zeroth through 31st bits, each of which corresponds to a memory word block shown in FIG. 2. The bit value "1" indicates that a memory word block corresponding to the bit will be activated. The bit value "0" indicates that a memory word block corresponding to the bit will not be activated.

Figure 7:
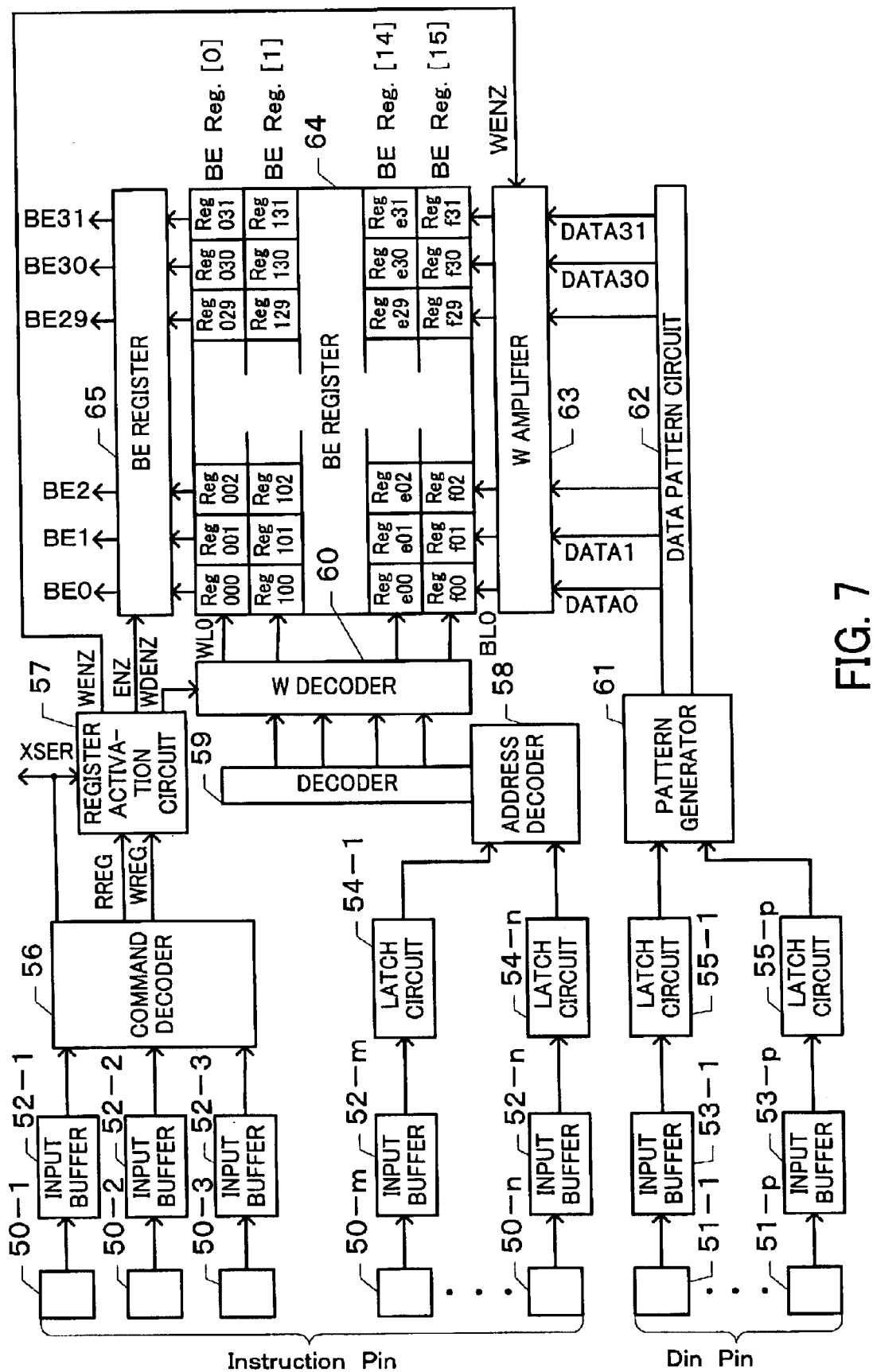
FIG. 7 is a view showing the structure of a circuit related to a BE register.

FIG. 7 is a view showing the structure of a circuit related to a BE register. As shown in FIG. 7, a circuit related to a BE register 64 includes instruction pins 50-1 through 50-n, din pins 51-1 through 51-p, input buffers 52-1 through 52-n, input buffers 53-1 through 53-p, latch circuits 54-1 through 54-n, latch circuits 55-1 through 55-p, a command decoder 56, a register activation circuit 57, an address decoder 58, a decoder 59, a W decoder 60, a pattern generator 61, a data pattern circuit 62, a W amplifier 63, a BE register 64, and a BE register 65.

The instruction pins 50-1 through 50-n are pins(terminals) used to input a command into the semiconductor memory. A command itself is input from the instruction pins 50-1 through 50-3 and data(address) for specifying a predetermined register in the BE register is input from the instruction pins 50-m through 50-n.

The din pins 51-1 through 51-p are pins used to input data to be stored in the BE register 64.

The input buffers 52-1 through 52-n amplify signals input from the instruction pins 50-1 through 50-n, respectively, and output them to the next stages respectively.

The input buffers 53-1 through 53-p amplify data input from the din pins 51-1 through 51-p, respectively, and output it to the next stages respectively.

The latch circuits 54-1 through 54-n latch data supplied from the input buffers 52-m through 52-n, respectively, in synchronization with a clock signal and supply it to the address decoder 58.

The latch circuits 55-1 through 55-p latch data supplied from the input buffers 53-1 through 53-p, respectively, in synchronization with a clock signal and supply it to the pattern generator 61.

The command decoder 56 decodes commands input from the input buffers 52-1 through 52-3 and outputs a read register RREG, write register WREG, and retrieval signal XSER.

The register activation circuit 57 accepts a read register RREG, write register WREG, and retrieval signal XSER output from the command decoder 56 and outputs a WDENZ signal, ENZ signal, and WENZ signal for activating the W decoder 60, BE register 65, and W amplifier 63 respectively.

The address decoder 58 decodes output from the latch circuits 54-1 through 54-n and supplies results to the decoder 59.

The decoder 59 decodes output from the address decoder 58 and supplies a result to the W decoder 60.

The W decoder 60 accepts output from the decoder 59 and selects a predetermined register in the BE register 64 by making a predetermined one of word lines WL0 through WL15 active.

The pattern generator 61 accepts output from the latch circuits 55-1 through 55-p, generates a pattern for writing to the BE register 64, and supplies it to the data pattern circuit 62.

The data pattern circuit 62 generates pieces of data DATA0 through DATA31 according to output from the pattern generator 61 and outputs them.

The W amplifier 63 supplies DATA0 through DATA31 supplied from the data pattern circuit 62 to the BE register 64 in synchronization with timing with which a WENZ signal becomes active.

As shown in FIG. 6, the BE register 64 includes BE Reg. [0] through [15] and has stored information indicative of whether to activate each memory word block.

The BE register 65 reads data, which has been stored in the BE register 64 and which is specified by the W decoder 60, in synchronization with an ENZ signal, generates BE0 through BE31 signals corresponding to bits, and outputs them.

Figure 8:
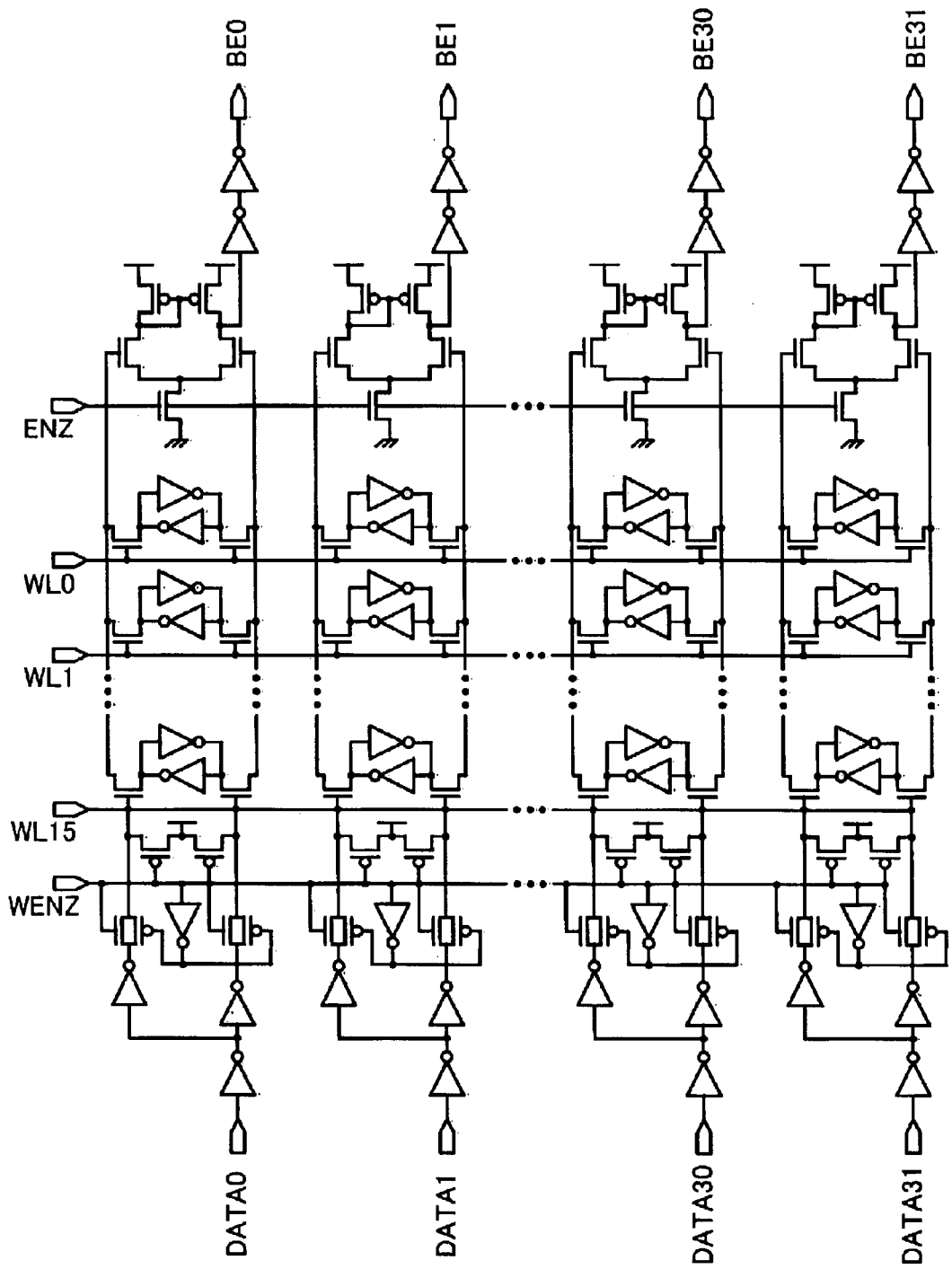
FIG. 8 is a view showing the detailed structure of the BE register shown in FIG. 7.

FIG. 8 is a view showing the detailed structure of the W amplifier 63, BE register 64, and BE register 65 shown in FIG. 7. As shown in FIG. 8, each of the W amplifier 63, BE register 64, and BE register 65 includes a plurality of transistors, inverters, transfers, and the like.

Figure 9:
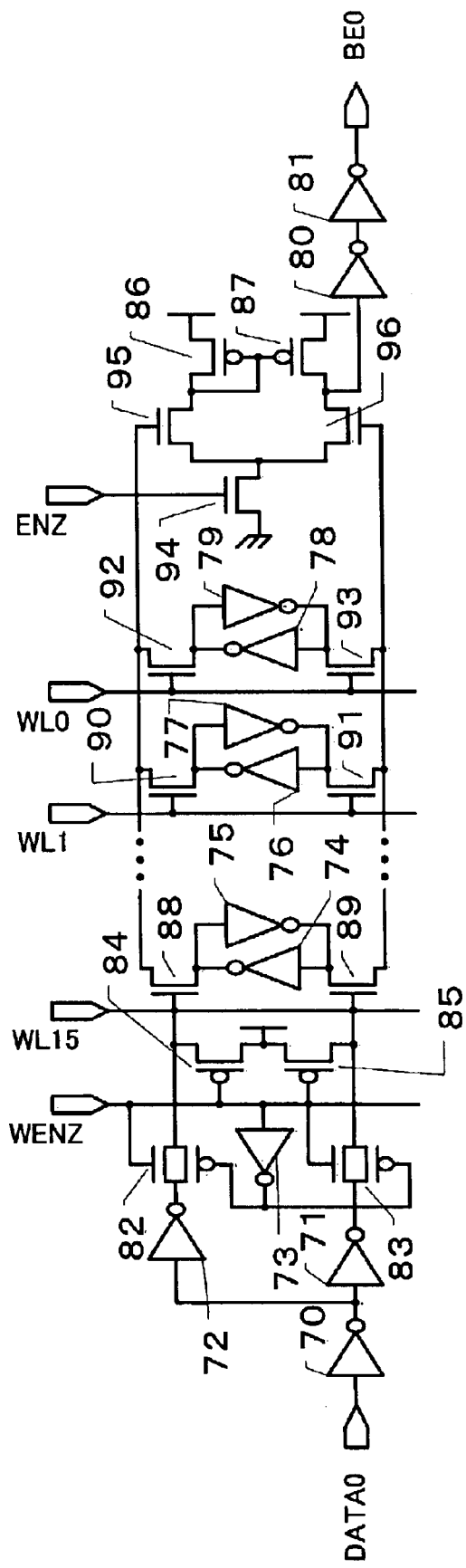
FIG. 9 is an enlarged view of a portion in the BE register shown in FIG. 8, which is located in the direction of a column and which is related to BE0.

FIG. 9 is an enlarged view of a portion in the BE register 64 shown in FIG. 8, which is located in the direction of a column and which is related to the BE0. As shown in FIG. 9, a portion, which is located in the direction of a column and which is related to the BE0, includes inverters 70 through 81, transfers 82 and 83, p-channel transistors (hereinafter referred to as p-transistors) 84 through 87, and n-channel transistors (hereinafter referred to as n-transistors) 88 through 96.

The inverters 70 through 72, transfers 82 and 83, and p-transistors 84 and 85 correspond to the W amplifier 63. The inverters 78 and 79 and n-transistors 92 and 93 make up a register corresponding to the Reg000 shown in FIG. 7. Similarly, the inverters 76 and 77 and n-transistors 90 and 91 make up a register corresponding to the Reg100 shown in FIG. 7. The inverters 74 and 75 and n-transistors 88 and 89 make up a register corresponding to the Regf00 shown in FIG. 7.

Figure 10:
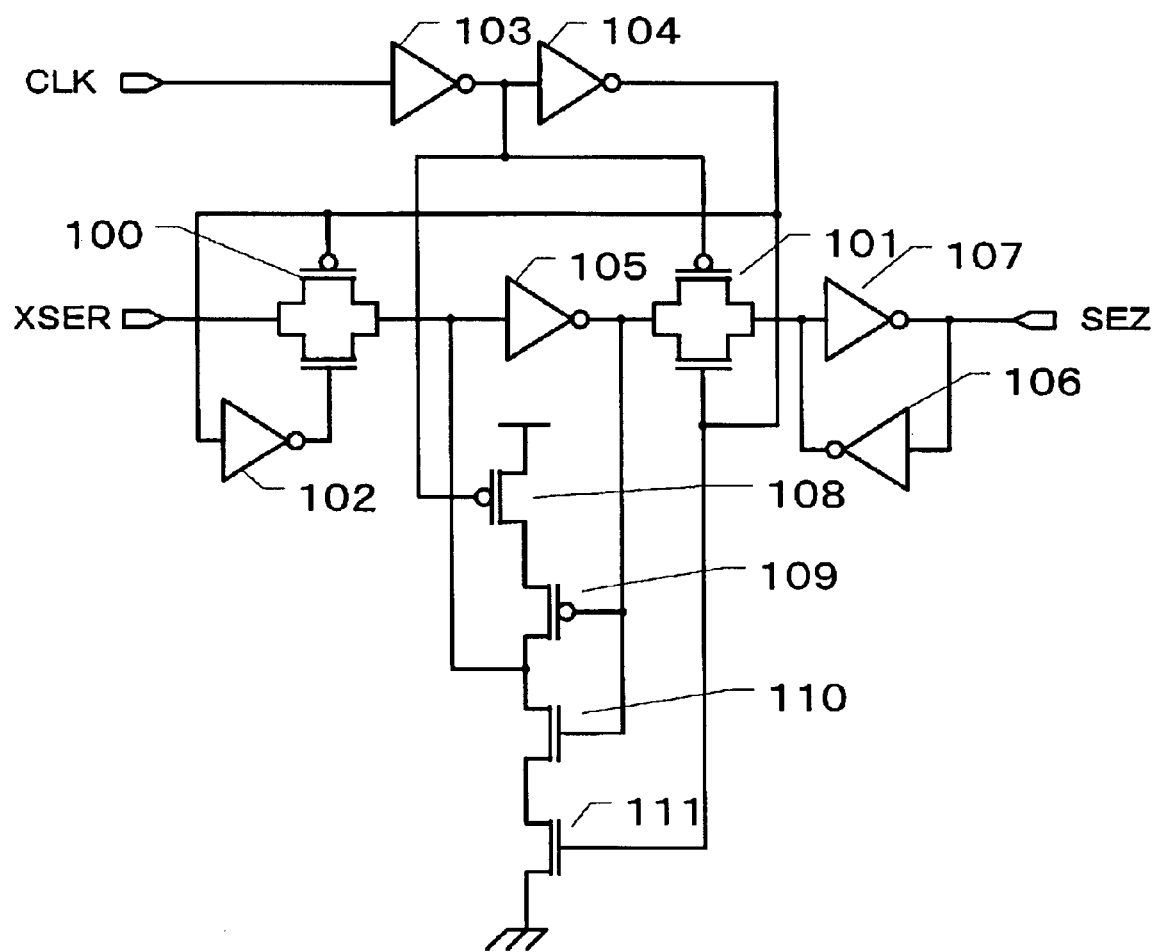
FIG. 10 is a view showing the detailed structure of the input buffer shown in FIG. 5.

FIG. 10 is a view showing the detailed structure of the input buffer 41b shown in FIG. 5. The input buffer 41a also has the same structure. As shown in FIG. 10, the input buffer 41b includes transfers 100 and 101, inverters 102 through 107, p-transistors 108 and 109, and n-transistors 110 and 111. The input buffer 41b latches an input XSER signal in synchronization with a CLK signal and outputs it as a SEZ signal.

Figure 11:
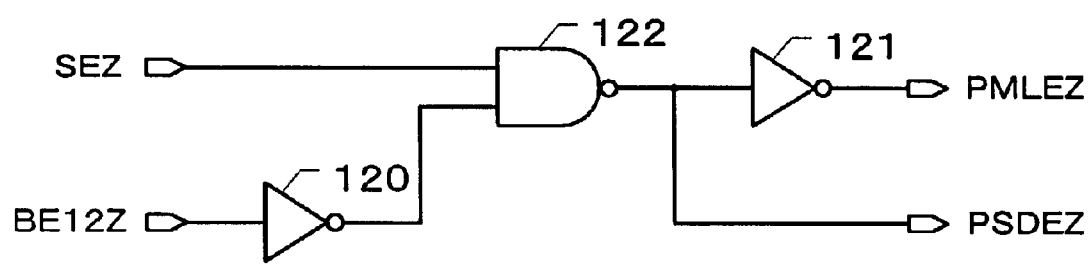
FIG. 11 is a view showing the detailed structure of the MSE generator shown in FIG. 5.

FIG. 11 is a view showing the detailed structure of the MSE generator 41c shown in FIG. 5. As shown in FIG. 11, the MSE generator 41c includes inverters 120 and 121 and a NAND gate 122. The MSE generator 41c generates a PMLEZ signal and PSDEZ signal by performing logical operations on an SEZ signal and BE12Z signal and outputs them.

Figure 12:
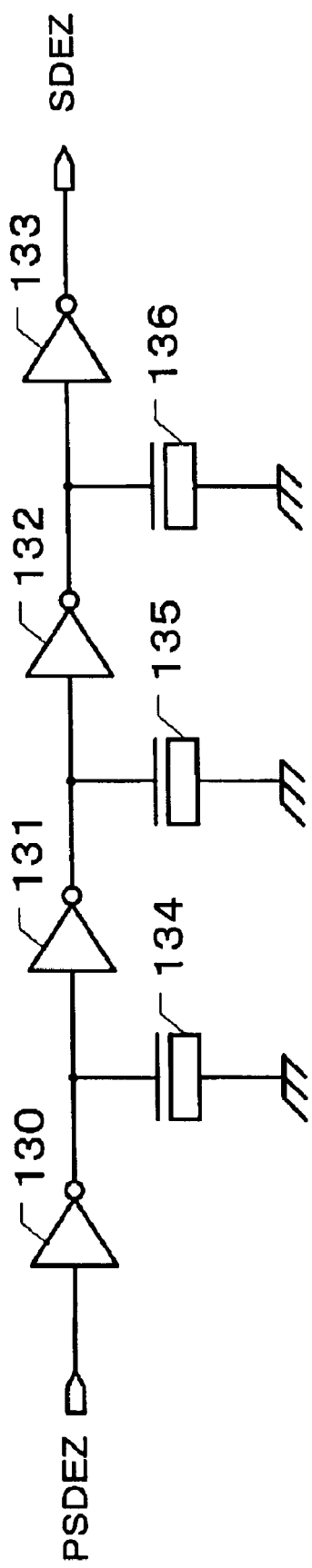
FIG. 12 is a view showing the detailed structure of the SDE buffer shown in FIG. 5.

FIG. 12 is a view showing the detailed structure of the SDE buffer 41d shown in FIG. 5. As shown in FIG. 12, the SDE buffer 41d includes inverters 130 through 133 and capacitors 134 through 136. The SDE buffer 41d accepts a PSDEZ signal, delays it by predetermined time, and outputs it as an SDEZ signal.

Figure 13:
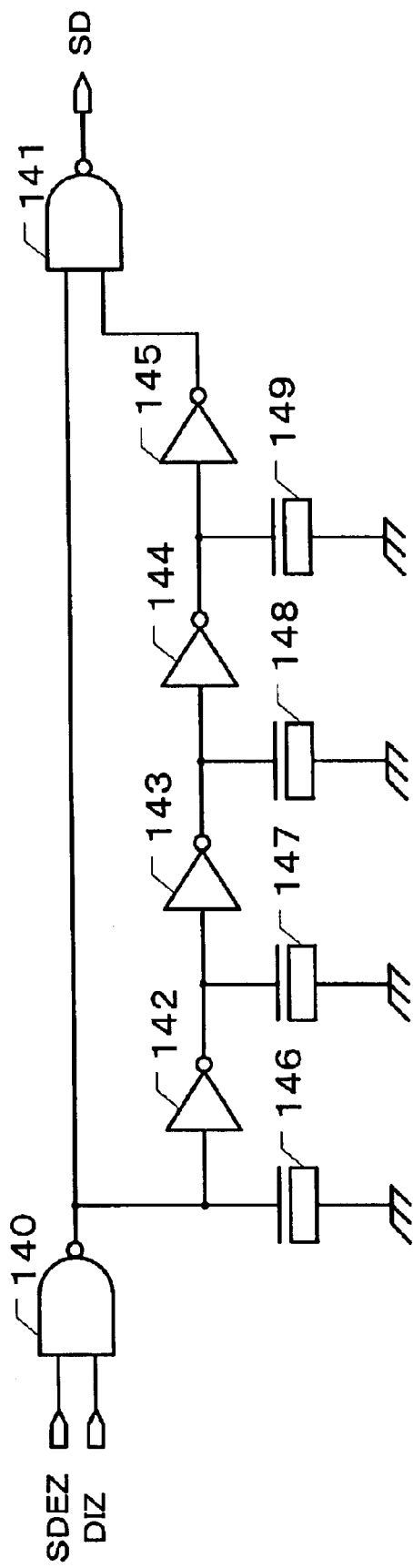
FIG. 13 is a view showing the detailed structure of the S/D buffer shown in FIG. 5.

FIG. 13 is a view showing the detailed structure of the S/D buffer 43 shown in FIG. 5. As shown in FIG. 13, the S/D buffer 43 includes NAND gates 140 and 141, inverters 142 through 145, and capacitors 146 through 149. The S/D buffer 43 outputs a signal obtained by performing a NAND operation on a result obtained by performing a NAND operation on an SDEZ signal and DIZ signal and a result obtained by delaying the above obtained result as an SD signal.

Figure 14:
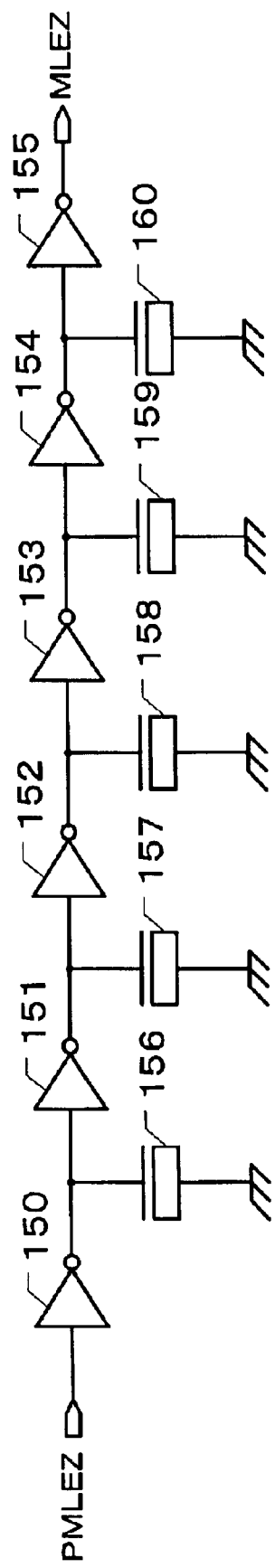
FIG. 14 is a view showing the detailed structure of the MSE buffer shown in FIG. 5.

FIG. 14 is a view showing the detailed structure of the MSE buffer 41e shown in FIG. 5. As shown in FIG. 14, the MSE buffer 41e includes inverters 150 through 155 and capacitors 156 through 160. The MSE buffer 41e delays an input PMLEZ signal and outputs it as an MLEZ signal.

Figure 15:
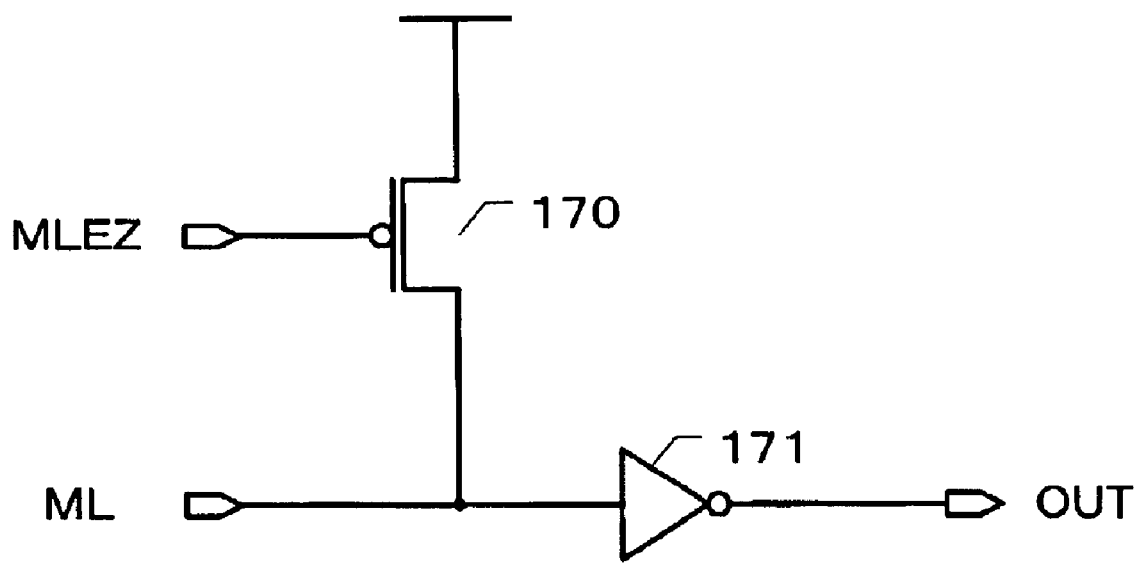
FIG. 15 is a view showing the detailed structure of the MLSA buffer shown in FIG. 5.

FIG. 15 is a view showing the detailed structure of the MLSA 44 shown in FIG. 5. As shown in FIG. 15, the MLSA 44 includes a p-transistor 170 and an inverter 171. The MLSA 44 inverts voltage applied to the match line ML and outputs it as an OUT signal. Moreover, when an MLEZ signal has gone into the "L" state, the MLSA 44 pre-charges the match line ML.

Figure 16:
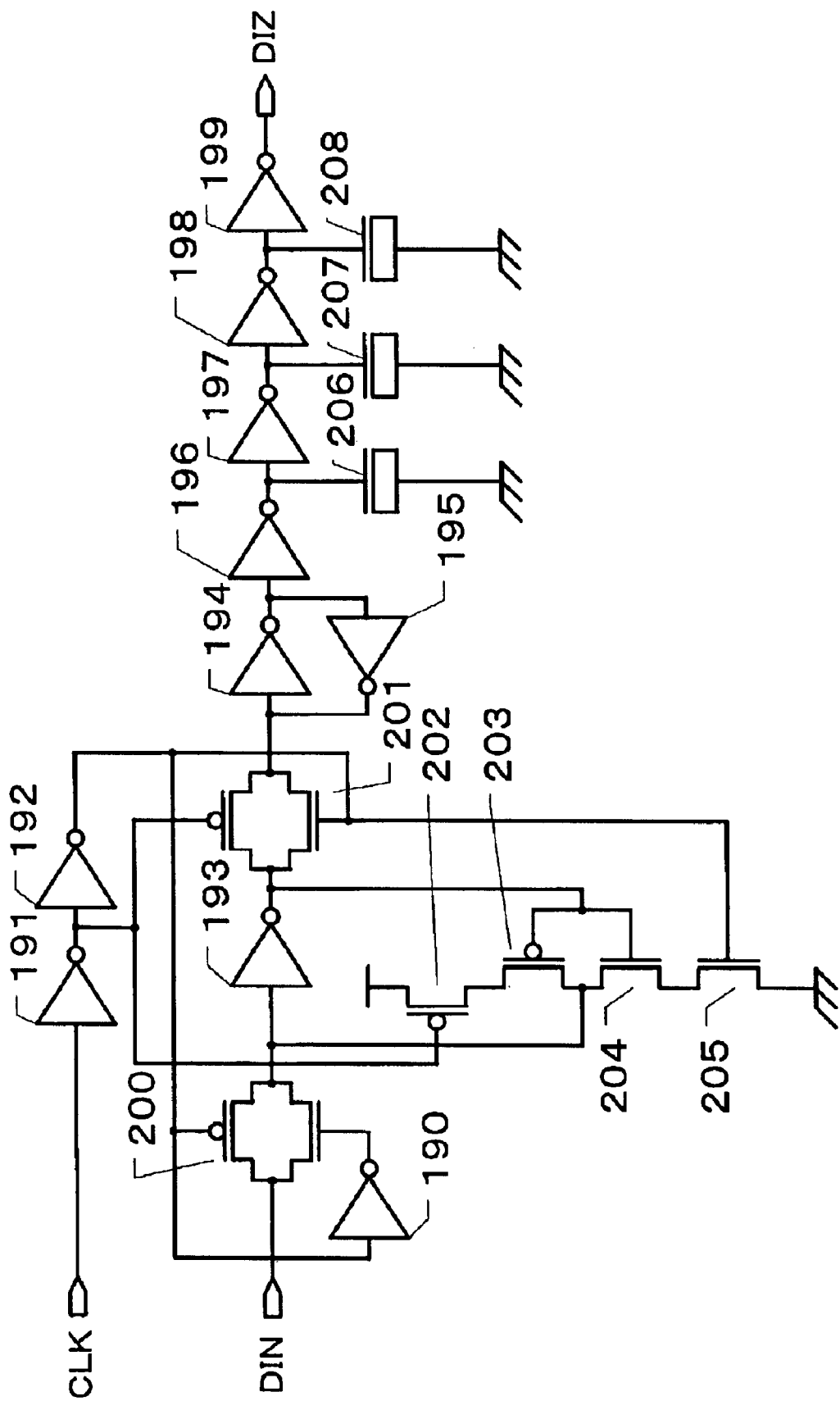
FIG. 16 is a view showing the detailed structure of the data input buffer shown in FIG. 5.

FIG. 16 is a view showing the detailed structure of the data input buffer 42 shown in FIG. 5. As shown in FIG. 16, the data input buffer 42 includes inverters 190 through 199, transfers 200 and 201, p-transistors 202 and 203, n-transistors 204 and 205, and capacitors 206 through 208. The data input buffer 42 latches an input DIN signal in synchronization with a CLK signal, delays it by predetermined time, and outputs it as a DIZ signal.

Now, operation in the above embodiment will be described.

First, operation performed when data is written to the BE register 64 shown in FIG. 7 will be described.

To write data to the BE register 64, a write command, data (one of the numbers from 0 through 15) for selecting a register where the data is written, and the data are input first to the instruction pins 50-1 through 50-3, the instruction pins 50-m through 50-n, and the din pins 51-1 through 51-p respectively.

32-bit data is input to the din pins 51-1 through 51-p. Each bit indicates whether to activate a memory word block shown in FIG. 2. The bit value of "1" indicates that a memory word block corresponding to the bit is activated and the bit value of "0" indicates that a memory word block corresponding to the bit is not activated.

It is assumed that data, the twelfth bit of which is "1" and the other bits of which are "0," is written to the BE Reg. [2]. Then a write command is input to the instruction pins 50-1 through 50-3. "2" for selecting the BE Reg. [2] is input to the instruction pins 50-m through 50-n. Moreover, data of a predetermined number of bits for generating the 32-bit data "0000000000010 . . . 0," the twelfth bit of which is "1" and the other bits of which are "0," is input to the din pins 51-1 through 51-p.

The write command input from the instruction pins 50-1 through 50-3 is supplied to the command decoder 56 via the input buffers 52-1 through 52-3. The command decoder 56 decodes the command supplied, realizes that this command is a write command, and puts a WREG signal into an active state. As a result, the register activation circuit 57 puts a WENZ signal and WDENZ signal into an active state. The W decoder 60 and the W amplifier 63 therefore go into an activated state.

At this time the signal which was input from the instruction pins 50-*m* through 50-*n*, which went through the input buffer 52-*m* through 52-*n* and latch circuits 54-1 through 54-*n*, and which was decoded by the address decoder 58 and decoder 59 has been supplied to the W decoder 60. The W decoder 60 therefore activates a predetermined register in the BE register 64 in response to this signal. In this example, "2" was input to the instruction pins 50-*m* through 50-*n*, so the BE Reg. [2] will be activated.

On the other hand, the data input from the din pins 51-1 through 51-*p* goes through the input buffer 53-1 through 53-*p* and latch circuits 55-1 through 55-*p* and is decoded by the pattern generator 61 and data pattern circuit 62. As a result, the 32-bit data "0000000000010 . . . 0," the twelfth bit of which is "1" and the other bits of which are "0," is generated and is supplied to the W amplifier 63.

The W amplifier 63 writes the data supplied from the data pattern circuit 62 to the BE Reg. [2] in the BE register 64.

The above is the operation of writing data to the BE register 64.

In the above example, a case where a piece of data is written has been described. However, a plurality of pieces of data can be written in series. Successively writing a plurality of pieces of data in this way will shorten time required to write as compared with individually writing these pieces of data.

Now, operation performed when predetermined data is retrieved from the memory word shown in FIG. 2 will be described with data written in the above way to the BE register 64.

To perform retrieval operation, a retrieval command and data for specifying a predetermined register in the BE register 64 are input first to the instruction pins 50-1 through 50-3 and the instruction pins 50-*m* through 50-*n* respectively.

The command decoder 56 obtains the command which is input to the instruction pins 50-1 through 50-3 and which is supplied via the input buffer 52-1 through 52-3, realizes that this command is a retrieval command, makes an RREG signal supplied to the register activation circuit 57 active, and makes an XSER signal supplied to the register activation circuit 57 and the input buffer 41*b* shown in FIG. 5 active.

The register activation circuit 57 makes an ENZ signal active to activate the BE register 65 and makes a WDENZ signal active to activate the W decoder 60.

It is assumed that "2" for selecting the BE Reg. [2] is input to the instruction pins 50-*m* through 50-*n*. Then the W decoder 60 activates the BE Reg. [2]. As a result, data which has been stored in the BE Reg. [2] is read and is supplied to the BE register 65.

The BE register 65 inverts the signal supplied from the BE register 64 and outputs it. As a result, BE12 of signals output from the BE register 65 goes into the "L" state and the others go into the "H" state.

Figure 17:
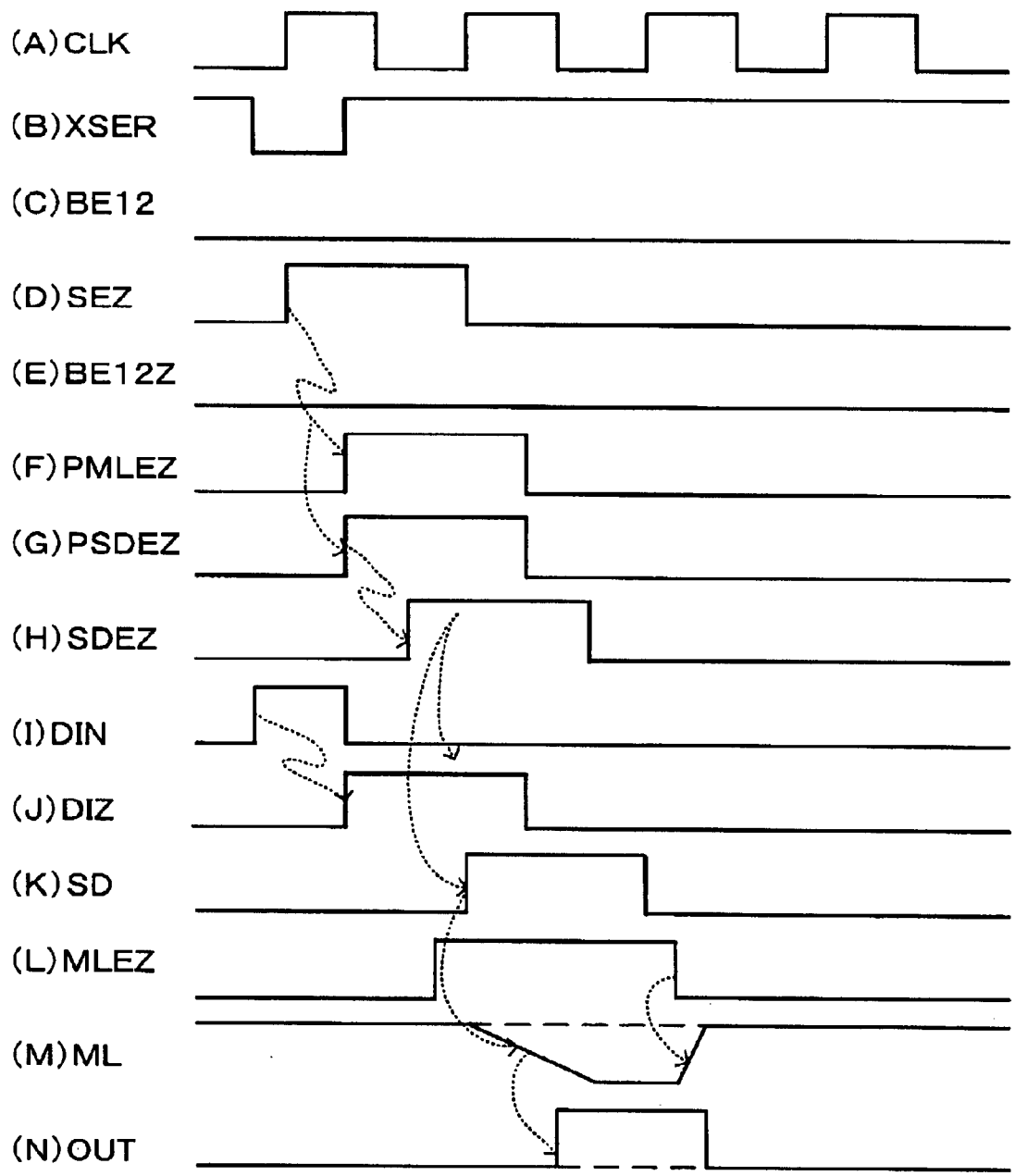
FIG. 17 is a timing chart for describing operation performed in the case of memory word block #12 being an object for activation.

FIG. 17 is a timing chart for describing operation performed when data is retrieved in the above way from a memory word block activated on the basis of data read from the BE register 64.

As shown in FIG. 17, when an XSER signal output from the command decoder 56 is put into an active (the "L") state (see FIG. 17(B)), BE12 of signals output from the BE register 65 goes into the "L" state (see FIG. 17(C)) and the other signals (BE0 through BE11 and BE13 through BE31) go into the "H" state, as a result of the above operation.

The input buffer 41*b* (see FIG. 10) latches the XSER signal in response to a clock signal CLK and supplies it to the MSE generator 41*c* as an SEZ signal (see FIG. 17(D)).

The input buffer 41*a* (see FIG. 10) latches the BE12 signal in response to the clock signal CLK and supplies it to the MSE generator 41*c* as a BE12Z signal (see FIG. 17(E))

The MSE generator 41*c* generates a PMLEZ signal (see FIG. 17(F)) and PSDEZ signal (see FIG. 17(G)) from the SEZ signal and BE12Z signal by the logical circuit shown in FIG. 11 and supplies them to the MSE buffer 41*e* and SDE buffer 41*d* respectively.

The SDE buffer 41*d* delays the input PSDEZ signal by predetermined time by the circuit shown in FIG. 12 and outputs it as an SDEZ signal (see FIG. 17(H)) for activating the S/D buffer 43.

The data input buffer 42 accepts input data (data to be retrieved) DIN (see FIG. 17(I)) and the clock signal CLK, latches the input data DIN in response to the clock signal CLK by the circuit shown in FIG. 16, and outputs a DIZ signal (see FIG. 17(J)) obtained by delaying the input data DIN by predetermined time to the S/D buffer 43.

As shown in FIG. 13, the S/D buffer 43 accepts the DIZ signal and SDEZ signal and outputs a result obtained by performing a NAND operation on a signal obtained by performing a NAND operation on these signals and a signal obtained by delaying the above obtained signal by predetermined time as an SD signal (see FIG. 17(K)).

The MSE buffer 41*e* delays the PMLEZ signal supplied from the MSE generator 41*c* by the circuit shown in FIG. 14 and outputs it as an MLEZ signal (see FIG. 17(L)) for activating the MLSA 44.

The S/D buffer 43 and the MLSA 44 in the memory word block #12 shown in FIG. 2 will be activated as a result of the above operation. The BE0 through BE11 signals and the BE13 through BE31 signals are in the "H" state, so the S/D buffers 43 and the MLSAs 44 in the other memory word blocks will not be activated.

When the MLSA 44 is activated, the match line ML is pre-charged. The data to be retrieved is supplied from the activated S/D buffer 43 to the cell 40*a* and retrieval operation will be performed.

Retrieval operation is performed according to the memory words in the activated memory word block #12. If data which has been stored in a memory word on which retrieval operation is being performed does not match the data to be retrieved, then the match line in FIG. 15 wired-OR-connected to the memory word becomes the "L" level (see FIG. 17(M)). As a result, output from the inverter 171 goes into the "H" state (see FIG. 17(N)). In contrast, if data which has been stored in a memory word on which retrieval operation is being performed matches the data to be retrieved, then the match line ML remains in the "H" state. As a result, output from the inverter 171 goes into the "L" state. This indicates that data which matches the data to be retrieved has been stored in this memory word.

If data which matches the data to be retrieved is found in this way, address data which corresponds to the match line is output to the outside of the semiconductor memory and the retrieval operation is completed.

The above is operation related to an activated memory word block. Now, operation related to a memory word block not activated will be described.

Figure 18:
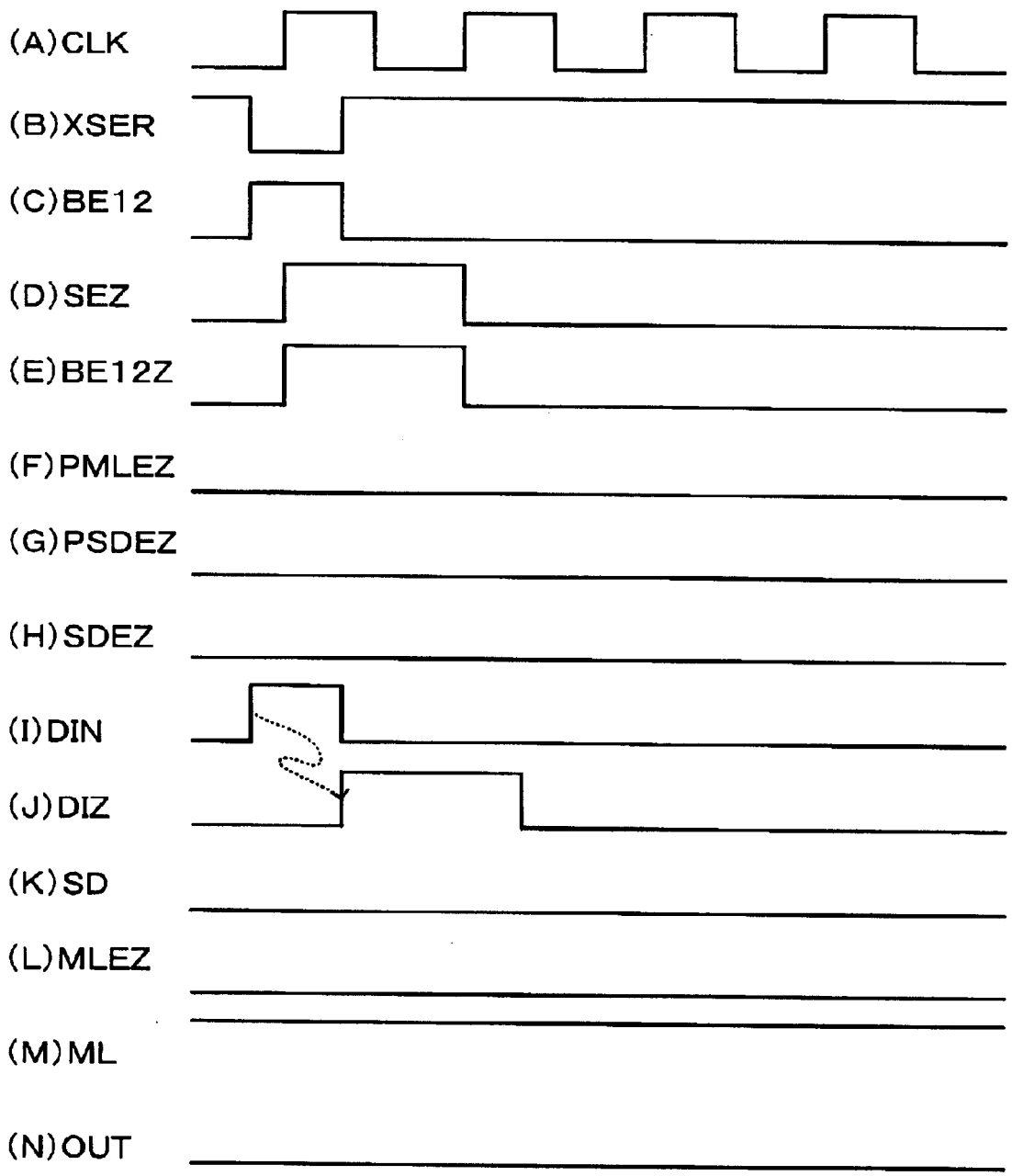
FIG. 18 is a timing chart for describing operation performed in the case of the memory word block #12 not being an object for activation.
Figure 19:
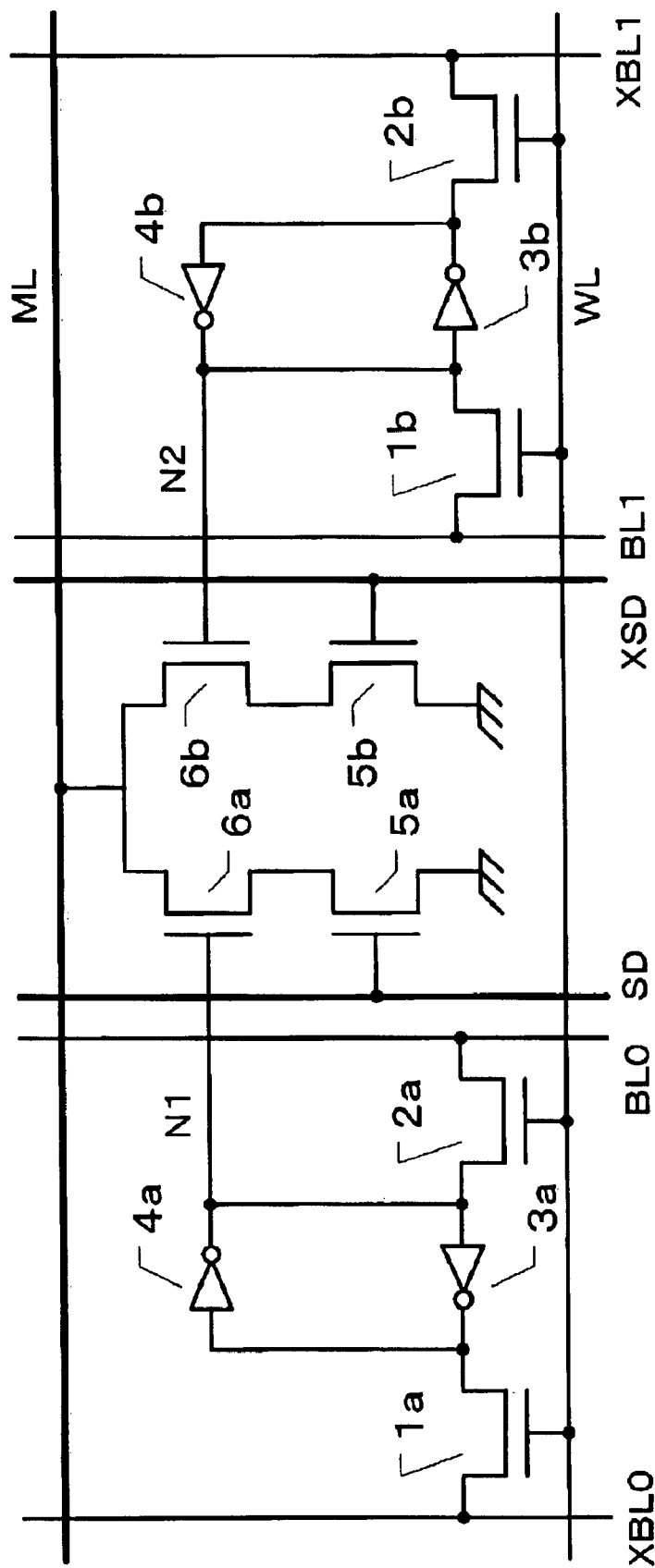
FIG. 19 is a view showing the structure of a cell in a conventional CAM.
Figure 21:
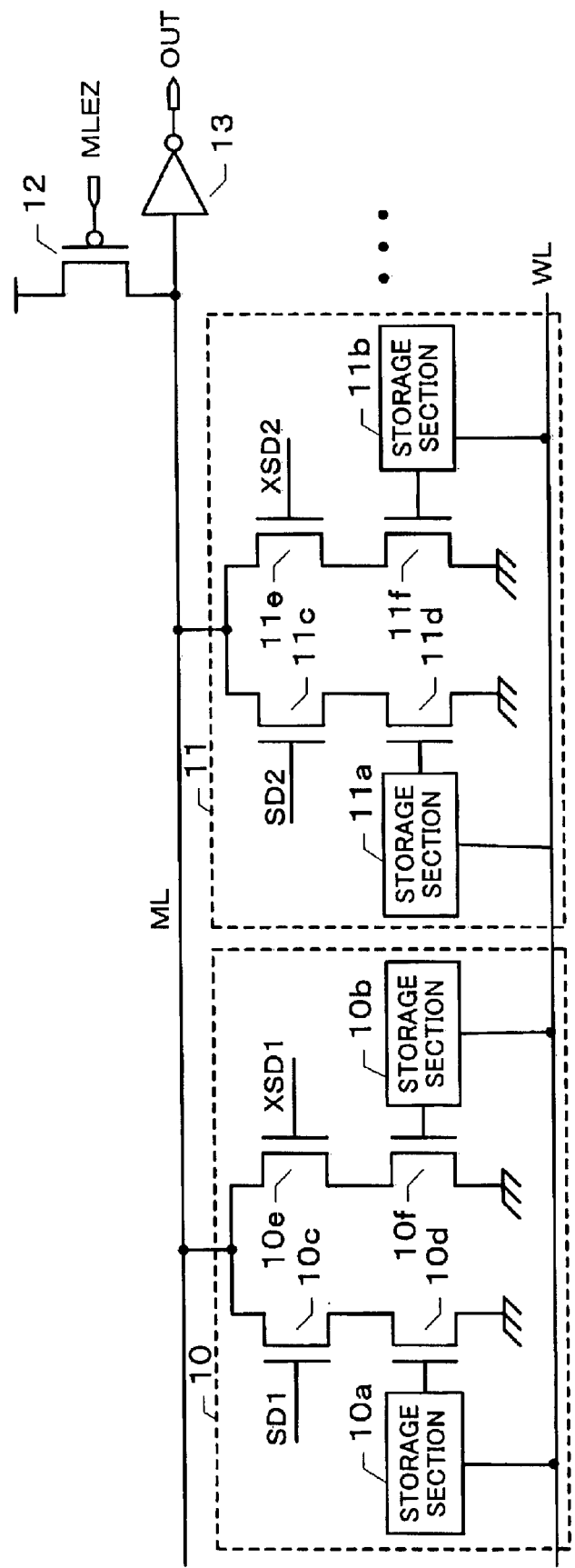
FIG. 21 is a view showing the structure of a conventional memory word.
Figure 22:
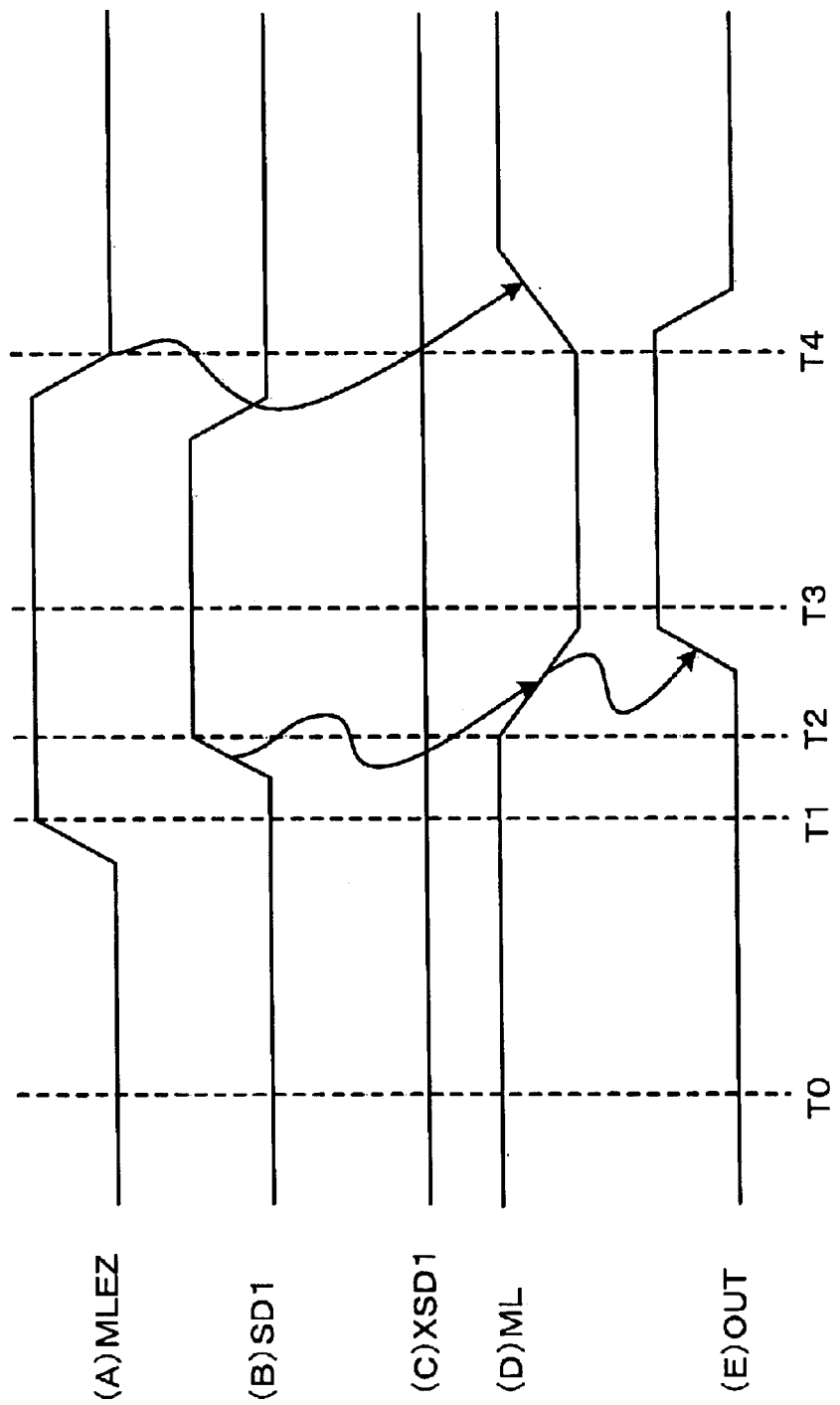
FIG. 22 is a timing chart for describing operation in the memory word shown in FIG. 21.

FIG. 18 is a timing chart for describing operation related to a memory word block not to be activated. As in FIG. 17, the memory word block #12 is taken as an example in FIG. 18.

If the memory word block #12 is not to be activated, then a BE12 signal (see FIG. 18(C)) output from the BE register 65 goes into the "H" state with timing with which an XSER signal (see FIG. 18(B)) goes into the "L" state.

As a result, a BE12Z signal (see FIG. 18(E)) output from the input buffer 41a also goes into the "H" state, so a PMLEZ signal (see FIG. 18(F)) and PSDEZ signal (see FIG. 18(G)) output from the MSE generator 41c remain in the "L" state.

Therefore, an SDEZ signal (see FIG. 18(H)) output from the SDE buffer 41d and an MLEZ signal (see FIG. 18(L)) output from the MSE buffer 41e remain in the "L" state. As a result, both of the S/D buffer 43 and the MLSA 44 are not activated.

Retrieval operation therefore will not be performed on the memory word block #12.

As described above, in the embodiment of the present invention, there are memory word blocks including a plurality of memory words, a memory word block, being an object for retrieval, is specified at retrieval operation time, only this memory word block is activated, and the other memory word blocks are not activated. This enables a reduction in consumption of power.

Moreover, the BE register 64 includes a plurality of registers, data regarding activation patterns according to objects for retrieval is stored in advance, and one of the plurality of registers is specified at retrieval operation time. As a result, an objective memory word block can be activated on a small amount of information.

Furthermore, by storing data according to objects in advance in the BE register 64, retrieval operation can be performed quickly as compared with a case where a memory word block, being an object for retrieval, is specified each time retrieval is performed.

Each of the circuits shown in the above embodiment is a simple example. It is a matter of course that the present invention is not limited to such cases. There are various modified embodiments.

As has been described in the foregoing, in the present invention, each memory word is divided into memory word blocks including a plurality of content addressable memory words, a predetermined activation pattern is selected at retrieval operation time from a plurality of activation patterns which have been stored in a storage circuit, a memory word block is activated according to this activation pattern, and only an activated content addressable memory word becomes an object for retrieval. Consumption of power therefore can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory comprising:
    a plurality of content addressable memory words;
    a plurality of memory cells connected to each content addressable memory word;
    memory word blocks each including N content addressable memory words;
    a storage circuit which has stored a plurality of patterns of information indicative of whether to activate each memory word block;
    an activation circuit for activating each content addressable memory word block according to a specified pattern in the case of specification information for specifying a predetermined pattern from among the plurality of patterns of information which has been stored in the storage circuit being input; and
    a specification circuit for specifying a content addressable memory word which has stored data corresponding to data to be retrieved from among a group of content addressable memory words activated by the activation circuit in the case of the data to be retrieved being input.

2. The semiconductor memory according to claim 1, wherein:
    each of the content addressable memory word blocks including:
    a driver for supplying the data to be retrieved to each memory cell; and
    a sense amplifier for amplifying a match signal from each of the content addressable memory words; and
    the activation circuit activates only the driver and the sense amplifier included in a predetermined content addressable memory word block.

3. The semiconductor memory according to claim 2, wherein the driver and the sense amplifier are adjacent to the content addressable memory word block.

4. The semiconductor memory according to claim 1, wherein:
    each bit included in information which has been stored in the storage circuit corresponds to each content addressable memory word block; and
    the activation circuit activates each content addressable memory word block according to the state of each bit included in the information which has been stored in the storage circuit.

5. The semiconductor memory according to claim 1, wherein the activation pattern is determined according to data to be retrieved.

6. The semiconductor memory according to claim 1, wherein the plurality of patterns of information which has been stored in the storage circuit enables a plurality of pieces of data to be written in block.

7. The semiconductor memory according to claim 1, wherein the specification information is input, together with a retrieval command.

8. The semiconductor memory according to claim 1, wherein information stored in the storage circuit is input via pins from which data to be retrieved is input.

* * * * *